United States Patent [19]

Boerstler et al.

[11] Patent Number: 5,396,182
[45] Date of Patent: Mar. 7, 1995

[54] LOW SIGNAL MARGIN DETECT CIRCUIT

[75] Inventors: David W. Boerstler, Millbrook; Edward B. Eichelberger, Hyde Park; Gary T. Hendrickson, Kingston; Charles B. Winn, Hyde Park, all of N.Y.

[73] Assignee: International Business Machines Corporation, Armonk, N.Y.

[21] Appl. No.: 955,573

[22] Filed: Oct. 2, 1992

[51] Int. Cl.6 ............................................. G01R 1/04
[52] U.S. Cl. ................................. 324/606; 324/768
[58] Field of Search ................ 324/158 R, 606, 768; 307/443, 310, 455

[56] References Cited

U.S. PATENT DOCUMENTS

| | | | |
|---|---|---|---|
| 2,757,280 | 7/1956 | Beard . | |
| 3,094,602 | 6/1963 | Wartella . | |
| 3,577,073 | 5/1971 | Cray | 324/73 |
| 3,668,425 | 6/1972 | Schmidt | 307/216 |
| 3,731,205 | 5/1973 | Gardner | 328/5 |
| 4,575,647 | 3/1986 | Astol et al. | 307/443 |
| 4,760,289 | 7/1988 | Eichelberger | 307/455 |

OTHER PUBLICATIONS

"Integrated Electronics–Analog and Digital Circuits and Systems" Millman and Halkias, McGraw Hill, 1972, p. 183.
"Motorola MECL System Design Handbook", 1988, pp. 18, 25, 33, 184, 185.
"Fairchild ECL Data Book", 1977, pp. 1-3, 2-5, 3-4, and 5-16.
"Differential Current Switch–High Performance at Low Power", Eichelberger et al, Journal of Research and Development, 1991.
IEEE Journal of Solid–State Circuits, vol. 26, No. 5, May 1991, "High–Performance Standard Cell Library and Modeling Technique for Differential Advanced Bipolar Current Tree Logic" by H. J. Greub.
IBM Research and Development, vol. 35, No. 1, May 1991, "An Adder Design Optimized for DCS Logic", by A. Weinberger.
Circuits and Devices, May 1990, "FRISC-E: A 250--MIPS Hybrid Microprocessor", by H. J. Grueb et al, pp. 16–25.
IBM Journal of Research and Development, vol. 35, No. 3, May 1991, "IBM Enterprise System/9000 Type 9212 System Controller and Memory Subsystem Design".

*Primary Examiner*—Kenneth A. Wieder
*Assistant Examiner*—Barry C. Bowser
*Attorney, Agent, or Firm*—Lawrence D. Cutter; Mark S. Walker

[57] ABSTRACT

A low signal margin detect circuit for detecting reduced signal levels in differential current switch (DCS) or current switch emitter follower (CSEF) circuits. The circuit is connected to the outputs of a DCS circuit or to the output of a current switch emitter follower circuit and a reference voltage. A signal difference between the inputs is determined and, if less than an established amount, an error signal is generated. The detect circuit is enabled by a TESTBIAS signal. Two error signals are developed, ERRORX and ERRORY, which can be dotted with the error signals from adjacent circuits in the X and Y directions. This enables detection of the failing circuit through the use of appropriate error signal detection devices.

2 Claims, 2 Drawing Sheets

LOW SIGNAL MARGIN DETECT CIRCUIT

BACKGROUND OF THE INVENTION

1. Field of the Invention

The present invention relates generally to solid state digital logic circuits and particularly to bipolar, emitter coupled logic (ECL) circuits. More particularly, the present invention relates to detection circuits for testing the operation and integrity of one or more circuit elements.

2. Background and Related Art

Digital logic circuits in current generation computers are frequently implemented as VLSI circuits. Bipolar emitter coupled logic (ECL) circuits predominate and are found in, for example, the IBM ES/9000 series of large computers.

Logic circuits have traditionally been implemented as current switch emitter follower (CSEF) circuits. More recently, differential current switch logic circuits (DCS) have been proposed to increase circuit speed without an accompanying increase in power. U.S. Pat. No. 4,760,289 to Eichelberger et al. (commonly assigned) for a "Two Level Differential Cascode Current Switch Masterslice" is an example of such a circuit and is incorporated by reference. The DCS circuit described in Eichelberger et al. improves switching speed by up to twenty percent without an increase in power.

Logic circuits, whether CSEF or DCS, are subject to failure due to VLSI defects. Most such defects lead to catastrophic circuit failure which can be effectively modelled by stuck faults. These stuck faults can be tested with test vectors which propagate the fault to observable points.

A second class of VLSI defects leads to reduced signal levels at circuit output nodes. The reduced signal may be interpreted as either a high value or low value by the circuits loading it. In the worst case, some loads may interpret the signal as high while others interpret it as low. This class of defects is considered untestable and results in reduced product quality and may affect product reliability.

A DCS signal is represented by the difference between two complementary signals. A VLSI defect, such as a global short or open, may cause one of the two outputs to fall to an intermediate level while the other output is fully functional. The resultant reduced difference signal or low margin signal, may be intermittent and untestable.

Prior art DCS systems have addressed this problem by adding a test biasing scheme to the DCS circuit. The test biasing circuitry pulls current from nodes internal to the DCS circuit. This creates problems, however, because the biasing circuitry even when off slows the circuit due to the criticality of these nodes to circuit performance. Inclusion of biasing circuitry also complicates the DC design of the circuit as the test bias current depends upon power level, circuit type and output dotting. If the outputs are shifted with a shift resistor the test bias circuit may not be designable due to potential saturation problems.

SUMMARY OF THE INVENTION

The present invention is directed to a circuit for testing current switch circuits with differential outputs. The test circuit receives an activation signal, has circuitry for amplifying the current switch output signals, circuitry for detecting a difference between the amplified signals, and circuitry for signalling an error when either no difference or a reduced difference between the output signals is detected.

The present invention also is directed to the testing of CSEF circuits having only a single output signal. The CSEF circuit is tested by supplying a voltage reference signal to one input of the testing circuitry and operating the circuitry as above.

It is therefore an object of the invention to provide a VLSI test circuit that can sense low signal margin conditions.

It is a further object of the invention to provide a test circuit that does not pull current from internal logic circuit nodes and therefore does not compromise circuit speed.

It is yet another object of the invention to provide a testing circuit that can test several connected circuits and provide a dotted output of test results to a test analysis device.

The foregoing and other objects, features and advantages of the invention will be apparent from the following more particular description of a preferred embodiment of the invention, as illustrated in the accompanying drawing wherein like reference numbers represent like parts of the invention.

DETAILED DESCRIPTION

The preferred embodiment of the present invention will be described with reference to the above described figures in which similar structures are represented by like reference numbers.

Figure 1:
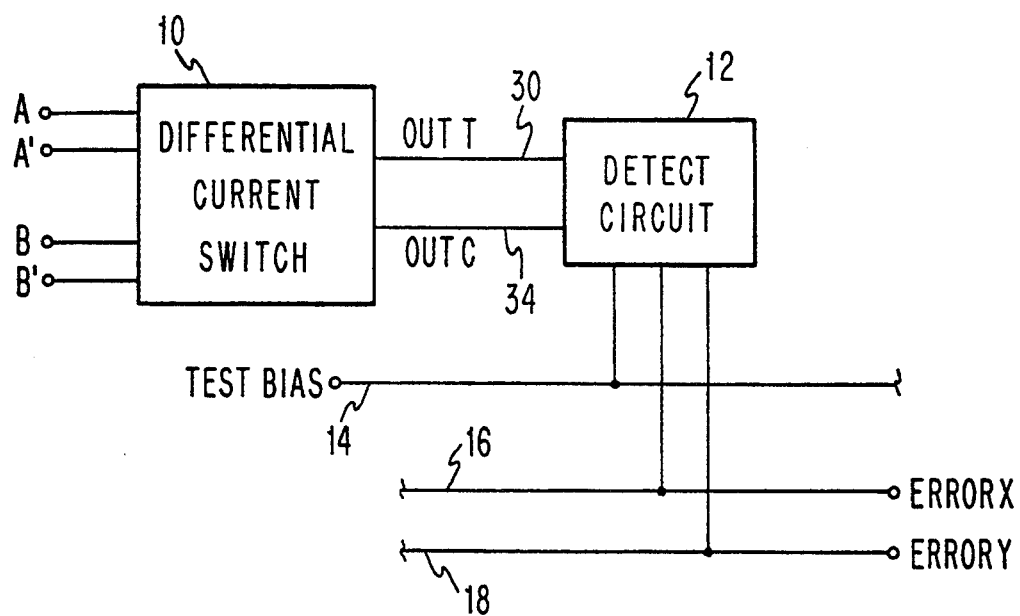
FIG. 1 is a block diagram illustrating the use of a test circuit according to the present invention in connection with a differential current switch (DCS) circuit.

FIG. 1 illustrates the use of a test circuit according to the present invention to test a DCS circuit 10. DCS circuit 10 can be a two level DCS circuit as shown or could have three or more levels. Inputs to DCS circuit 10 are shown as two differential pairs, A A' and B B', where A' and B' are the complements of A and B respectively. The differential outputs of circuit 10 are OUTT and OUTC. A low signal margin detect circuit 12 according to the present invention receives OUTT and OUTC as inputs and generates ERRORX 16 and ERRORY 18 as outputs. TESTBIAS signal 14 enables the detect circuit.

Figure 2:
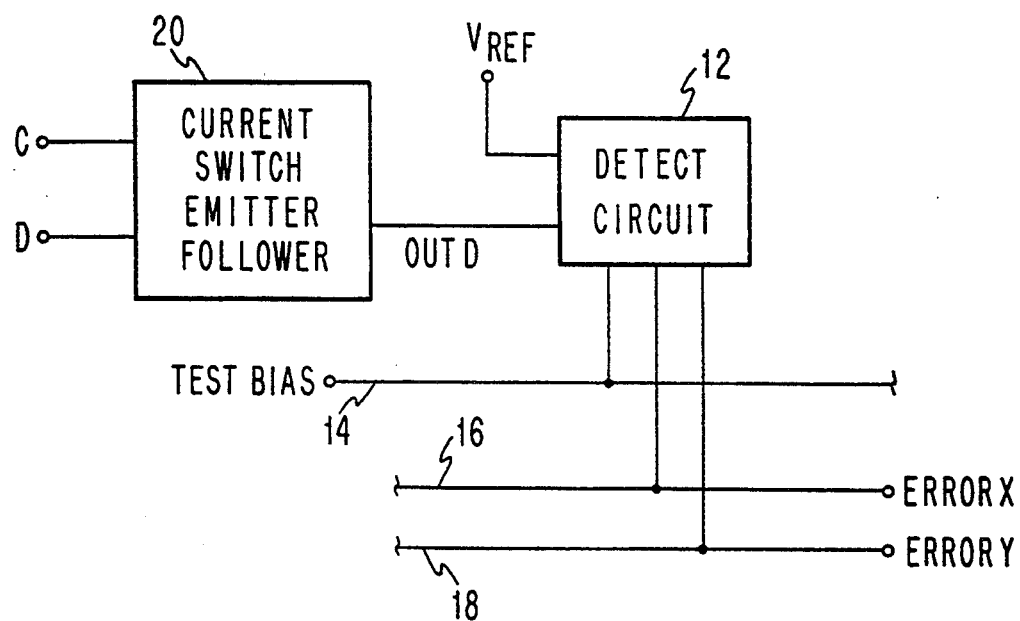
FIG. 2 is a block diagram illustrating the use of a test circuit according to the present invention in connection with a CSEF circuit.

FIG. 2 illustrates the use of a detect circuit according to the present invention with a CSEF logic circuit 20. CSEF circuit 20 has as its inputs signals C and D with OUTD representing the output signal. Detect circuit 12 receives OUTD as one input and a reference voltage, $V_{ref}$ as the other input. Output signals ERRORX 16 and ERRORY 18 are generated when TESTBIAS signal 14 is enabled.

Figure 3:
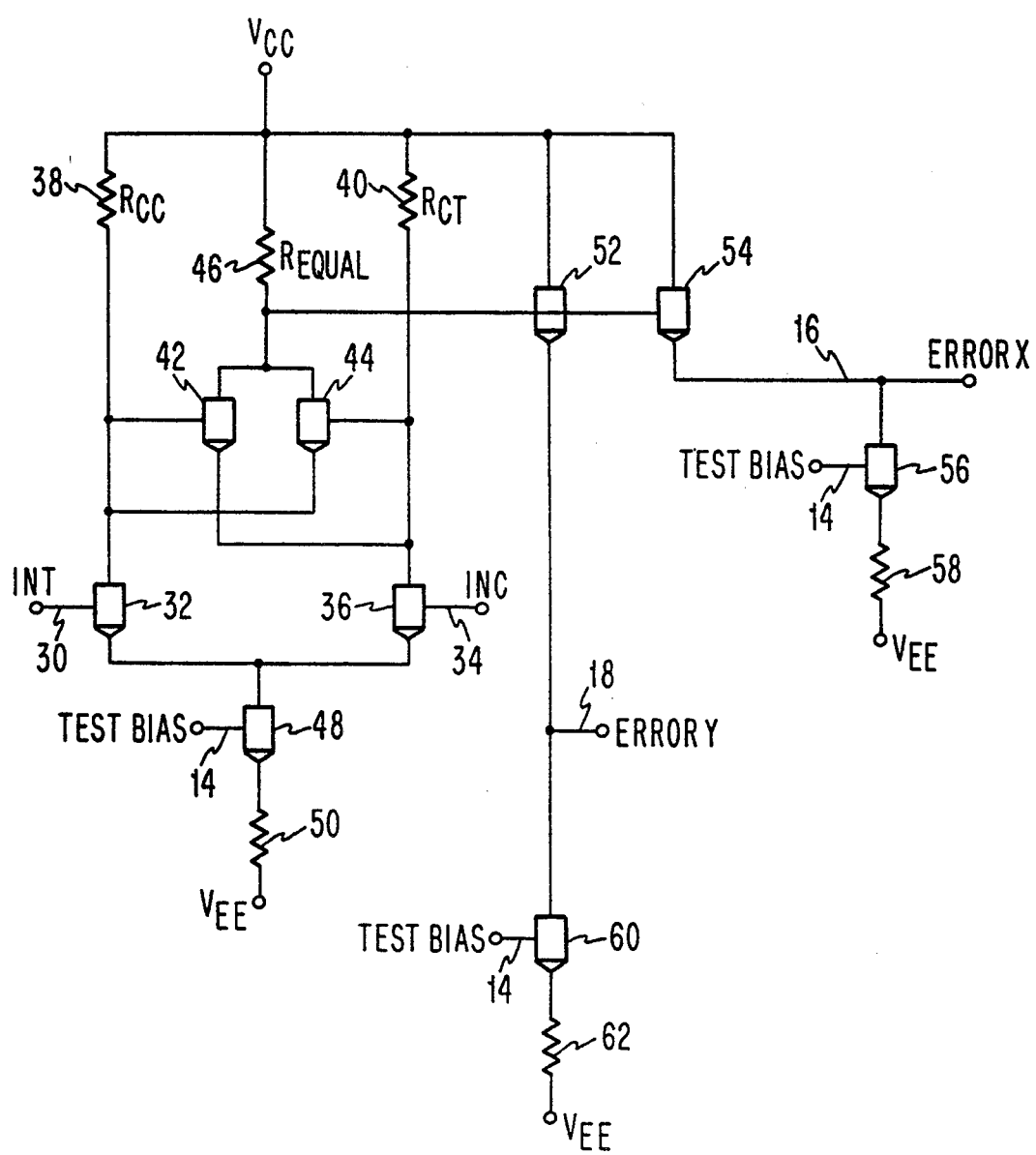
FIG. 3 is a circuit diagram illustrating the preferred embodiment of the present invention.

The low signal margin detect circuit 12 will be described in greater detail with reference to FIG. 3. The circuit is described based on the use of NPN transistors, however, it will be understood that PNP or other equivalent components could be substituted to perform equivalent function.

The DCS differential signal is input to detect circuit 12 on complementary inputs INT 30 and INC 34 corresponding to OUTT and OUTC in FIG. 1 and to $V_{ref}$ and OUTD in FIG. 2. The detect circuit is enabled by TESTBIAS signal 14. The differential signal is amplified on $R_{ct}$ 40 and $R_{cc}$ 38. When the amplified differential signal is greater than $V_{be}$ of transistors 42 and 44 current is drawn through $R_{equal}$ 46 causing both outputs ERRORX and ERRORY to remain low since transistors 52 and 54 remain off.

When the voltage between INT 30 and INC 34 is equal, no current flows in $R_{equal}$ 46 causing both error outputs to go high signalling an error condition. Outputs ERRORX and ERRORY pull up whenever the detect circuit senses a reduced signal level difference between inputs INT 30 and INC 34. The input level difference at which an error is detected is adjustable by appropriate choice of resistor values for resistors $R_{ct}$, $R_{cc}$ and $R_{equal}$.

The detect circuit is enabled by TESTBIAS signal 14. This signal is connected to the base of transistors 48, 60 and 56 whose emitters are connected through resistors 50 62 and 58 respectively to voltage $V_{ee}$.

Resistors $R_{cc}$ 38, $R_{ct}$ 40 and $R_{equal}$ 46 and the collectors of transistors 52 and 54 are connected to voltage $V_{cc}$. The preferred embodiment uses resistors with the following values: $R_{equal}$=6700 Ohms; $R_{cc}$=$R_{ct}$=11250 Ohms; resistor 50=3000 Ohms; and resistors 58,62 =4000 ohms.

The output ERRORX is intended to be dotted between many DCS detect circuits aligned in the "X" direction and ERRORY is intended to be dotted in the "Y" direction (direction "Y" being orthogonal to direction "X"). The dotting or combination of signals is accomplished using known techniques. Any circuit with reduced signal levels will trigger two error lines. By detecting which X and which Y failed the failing circuit can be diagnosed since the X and Y values serve to identify a particular circuit. Reduced signal levels can be detected even when an ERRORX or ERRORY line fails, although with reduced diagnostics.

The detect circuit of the present invention has many advantages. The circuit to be tested is faster because the test devices load the circuit outputs rather than critical internal nodes. This novel detect circuit does not rely on following circuits to propagate signals to observable points.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

The invention claimed is:

1. A system for testing a plurality of logic circuits comprising:
   a plurality of testing circuits each of which is connected to at least one logic output signal of said plurality of logic circuits;
   each of said testing circuits including:
   means for activating said testing circuit in response to an activation signal;
   means for receiving and amplifying a first input signal and a second input signal;
   means for detecting a difference between said first and second amplified signals;
   means responsive to said detecting means for generating a difference signal;
   means responsive to said difference signal for signalling a first and second error signal when said detected difference is below a given signal difference threshold;
   means for combining said first error signal from each of said plurality of testing circuits in a first direction;
   means for combining said second error signal from each of said plurality of testing circuits in a second direction orthogonal to said first direction; and
   means for testing said combined signals in said first and second directions to identify said logic circuit with said error.

2. A system for testing a plurality of logic circuits comprising:
   a plurality of testing circuits each of which is connected to at least one logic output signal of said plurality of logic circuits;
   each of said testing circuits including:
   means for activating said testing circuit in response to an activation signal;
   means for receiving and amplifying a first input signal and a second input signal;
   said amplifying means comprising:
   means for conductively receiving a first voltage potential;
   a first and second transistor each having a base, collector and emitter;
   said collectors of said first and second transistors being connected via respective resistors to said first voltage potential;
   said emitters of said first and second transistors being connected to said activating means; and
   said first and second input signals being respectively applied to the base of said first and second transistors;
   means for detecting a difference between said first and second amplified signals;
   said detecting means comprising:
   third and fourth transistors each having a base, emitter and collector;
   a third resistor connected to a first connection node between said means for receiving said first voltage potential and said collectors of said third and fourth transistors;
   said base of said third transistor and said emitter of said fourth transistor being commonly connected to a second connection node between said collector of said first transistor and said first resistor;
   said base of said fourth transistor and said emitter of said third transistor being commonly connected to a third connection node between said collector of said second transistor and said second transistor;
   means responsive to said detecting means for generating a difference signal at said first connection node;
   means responsive to said difference signal for signalling a first and second error signal when said detected difference is below a given signal difference threshold;
   means for combining said first error signal from each of said plurality of testing circuits in a first direction;
   means for combining said second error signal from each of said plurality of testing circuits in a second direction orthogonal to said first direction; and
   means for testing said combined signals in said first and second directions to identify said logic circuit with said error.

* * * * *